United States Patent
Chang et al.

(10) Patent No.: US 7,301,694 B2
(45) Date of Patent: Nov. 27, 2007

(54) OFF-AXIS PROJECTION OPTICAL SYSTEM AND EXTREME ULTRAVIOLET LITHOGRAPHY APPARATUS USING THE SAME

(75) Inventors: Seung-Hyuk Chang, Seongnam-si (KR); I-Hun Song, Seongnam-si (KR); Young-Soo Park, Suwon-si (KR); Suk-Pil Kim, Yongin-si (KR); Hoon Kim, Siheung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/453,775

(22) Filed: Jun. 16, 2006

(65) Prior Publication Data

US 2006/0284113 A1 Dec. 21, 2006

(30) Foreign Application Priority Data

Jun. 18, 2005 (KR) ...................... 10-2005-0052727

(51) Int. Cl.
*G02B 5/08* (2006.01)
(52) U.S. Cl. .................. 359/351; 359/859; 355/53
(58) Field of Classification Search ............... 359/350, 359/351, 359, 360, 365, 366, 729, 731, 858, 359/859; 355/53, 67; 378/35
See application file for complete search history.

(56) References Cited

U.S. PATENT DOCUMENTS 5,805,365 A * 9/1998 Sweatt .................. 359/858

FOREIGN PATENT DOCUMENTS

WO    WO 2004/010200 A1 *   1/2004

\* cited by examiner

*Primary Examiner*—Alessandro Amari
(74) *Attorney, Agent, or Firm*—Harness, Dickey & Pierce, P.L.C.

(57) ABSTRACT

Example embodiments are directed to an off-axis projection optical system including first and second mirrors that are off-axially arranged. The tangential and sagittal radii of curvature of the first mirror may be $R_{1t}$ and $R_{1s}$, respectively. The tangential and sagittal radii of curvature of the second mirror may be $R_{2t}$ and $R_{2s}$, respectively. The incident angle of the beam from an object point to the first mirror 10 may be $i_1$, and an incident angle of the beam reflected from the first mirror 10 to the second mirror 30 is $i_2$. The values of $R_{1t}$, $R_{1s}$, $R_{2t}$, $R_{2s}$, $i_1$ and $i_2$ may satisfy the following Equation $R_{1t} \cos i_1 = R_{2t} \cos i_2$ $R_{1s} = R_{1t} \cos^2 i_1$ $R_{2s} = R_{2t} \cos^2 i_2$.

18 Claims, 5 Drawing Sheets

OFF-AXIS PROJECTION OPTICAL SYSTEM AND EXTREME ULTRAVIOLET LITHOGRAPHY APPARATUS USING THE SAME

PRIORITY STATEMENT

This application claims the benefit of priority to Korean Patent Application No. 10-2005-0052727, filed on Jun. 18, 2005, in the Korean Intellectual Property Office, the entire contents of which is incorporated herein by reference.

BACKGROUND OF THE INVENTION

1. Field of the Invention

Example embodiments of the present invention relate to an off-axis projection optical system and an extreme ultraviolet (EUV) lithography apparatus using the same.

2. Description of the Related Art

In a photolithography process of a semiconductor manufacturing process, a light exposure technology used to realize a direct writing resolution of less than 100 nm may involve the use of a light exposure wavelength within the EUV band. In EUV lithography technology, extreme ultraviolet light having a very short wavelength of less than 100 nm, for example, a wavelength of about 13.5 nm, may be used.

Because most materials absorb light in the EUV band, it may be difficult and/or impossible to use a refractive optical device for EUV light. Therefore, a reflection mask may be required for the light exposure technology using the EUV light. In order for the EUV light reflected from the reflection mask to travel toward a wafer, a conventional projection optical system having a plurality of reflection mirrors may be used and/or required. The EUV light may be radiated to the reflection mask installed in a chamber. The EUV light reflected from the reflection mask may be incident on the wafer after being reflected by the plurality of reflection mirrors of the projection optical system, thereby forming a pattern corresponding to the mask on the wafer.

As described above, conventional EUV light lithography uses and/or requires a projection optical system having a plurality of reflection mirrors.

FIG. 1 schematically illustrates a conventional on-axis projection optical system, which may be used in a light exposure apparatus for performing a conventional EUV lithography process.

Referring to FIG. 1, EUV light 4 radiated from a EUV source onto a mask 1 may be reflected by the mask 1 and then incident on a light exposure apparatus 2.

First and second mirrors 3 and 5 for reflecting the EUV light 4 toward an image plane where a wafer 6 may be disposed may be included in the light exposure apparatus 2. First and second center holes 3a and 5a through which the EUV light 4 passes may be formed in the center of the first and second mirrors 3 and 5, respectively. The second mirror 5 may be disposed near the mask 1 while the first mirror 3 may be disposed relatively far from the mask 1.

The EUV light 4, which may be reflected from the mask 1 and incident on the second mirror 5 after passing through the second center hole 5a formed in the second mirror 5 is divergent. The EUV light 4 incident on the first mirror 3 may be reflected to the second mirror 5, which may reflect the EUV light 4 to form a convergent beam. Then, the EUV light 4 may be radiated to the wafer 6 onto the image plane after passing through the first center hole 3a formed in the first mirror 3.

In a conventional on-axis projection optical system, because the center holes 3a and 5a may be formed in the first and second mirrors 3 and 5, respectively, stray light 4' traveling directly from the mask 1 toward the wafer 6 through the first and second center holes 3a and 5a of the respective first and second mirrors 3 and 5 may exist.

Therefore, a conventional light exposure apparatus 2 using a typical on-axis projection optical system requires a shielding member 7. An example of the shielding member 7 is illustrated in FIG. 2. The shielding member may reduce and/or prevent stray light from traveling directly toward the wafer 6. The shielding member 7 may be disposed at a location between the first and second mirrors 3 and 5 to block a central portion of the EUV light 4. That is, the stray light 4' traveling toward the first center hole 3a through the second center hole 5a of the second mirror 5 may be partially or completely blocked by the shielding member 7.

The shielding member 7 may be supported by a narrow strip-shaped support 8 so the shielding member 7 may block the central portion of the EUV light 4. Referring to FIG. 2, the support 8 for supporting the shielding member 7 may be cross-shaped, for example.

A drawback of conventional on-axis projection optical systems is that the shielding member 7 for blocking the stray light 4' is necessary. Further, the shielding member 7 may cause diffraction, scattering and flare, for example.

SUMMARY OF THE INVENTION

Example embodiments of the present invention provide an off-axis projection optical system in which a shielding member, which may cause a variety of problems, is unnecessary. A EUV lithography apparatus according to an example embodiment of the present invention may use an off-axis projection optical system.

An example embodiment of the present invention provides an off-axis projection optical system. The off-axis projection optical system may include first and second mirrors that are off-axially arranged. The tangential and sagittal radii of curvature of the first mirror may be $R_{1t}$ and $R_{1s}$, respectively. The tangential and sagittal radii of curvature of the second mirror may be $R_{2t}$ and $R_{2s}$, respectively. An incident angle of a beam from an object point to the first mirror 10 may be $i_1$, and an incident angle of the beam reflected from the first mirror 10 to the second mirror 30 may be $i_2$. The values $R_{1t}$, $R_{1s}$, $R_{2t}$, $R_{2s}$, $i_1$ and $i_2$ may satisfy the following Equation.

$$R_{1t} \cos i_1 = R_{2t} \cos i_2$$

$$R_{1s} = R_{1t} \cos^2 i_1$$

$$R_{2s} = R_{2t} \cos^2 i_2$$

According to an example embodiment of the present invention, the first mirror may be a convex mirror and the second mirror may be a concave mirror.

According to an example embodiment of the present invention, each of the first and second mirrors may be an aspheric mirror.

According to an example embodiment of the present invention, each of the first and second mirrors may be bilaterally symmetric.

An example embodiment of the present invention provides a lithography apparatus. The lithography apparatus may irradiate a beam having mask pattern information to a wafer by using an off-axis projection optical system having one or more of the features described above.

According to an example embodiment of the present invention, the beam may be a EUV beam.

According to an example embodiment of the present invention, the mask may be a reflective mask.

An example embodiment of the present invention provides an off-axis projection optical system. The off-axis projection optical system may include a first mirror for reflecting a EUV beam and a second mirror for reflecting the EUV beam. The first and the second mirrors may be arranged off-axially and configured to reduce third order aberration.

An example embodiment of the present invention provides a lithography apparatus. The lithography apparatus may include an off-axis projection optical system including a first mirror for reflecting a EUV beam and a second mirror for reflecting the EUV beam. The first and the second mirrors may be arranged off-axially and configured to reduce third order aberration. The lithography apparatus may not include a shielding member according to an example embodiment of the present invention.

BRIEF DESCRIPTION OF THE DRAWINGS

The above and other features and advantages of the present invention will become more apparent by describing in detail example embodiments of the present invention with reference to the attached drawings in which.

DETAILED DESCRIPTION OF EXAMPLE EMBODIMENTS OF THE INVENTION

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
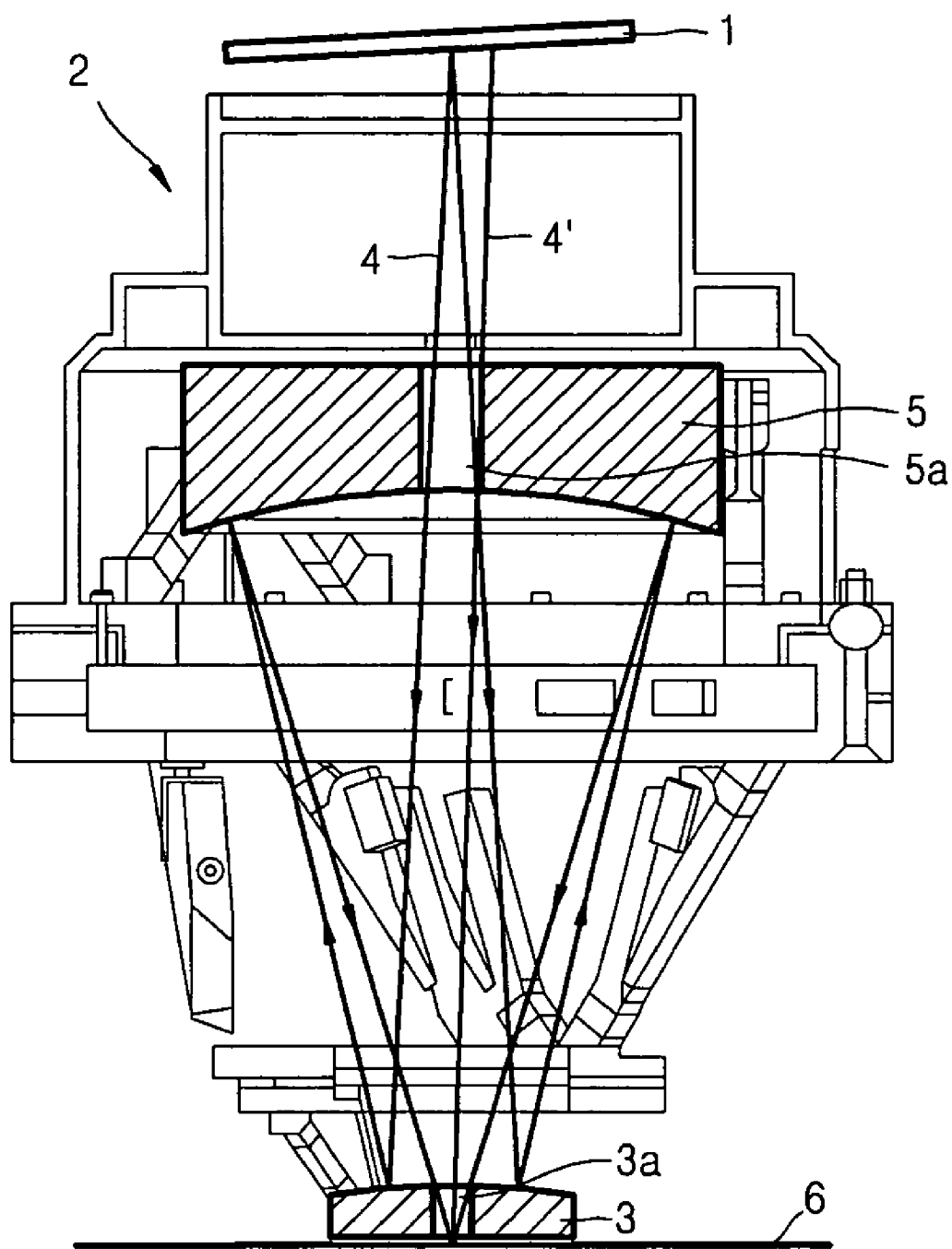
FIG. 1 is a schematic view of a conventional on-axis projection optical system used in a EUV light exposure apparatus for performing a lithography process.
Figure 2:
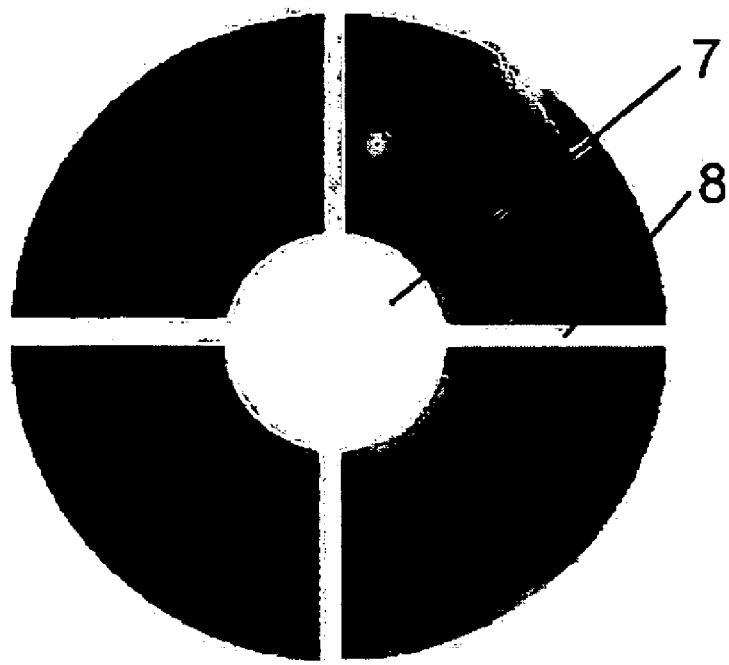
FIG. 2 is a view of a shielding member used in a light exposure apparatus using the on-axis projection optical system illustrated in FIG. 1.
Figure 3:
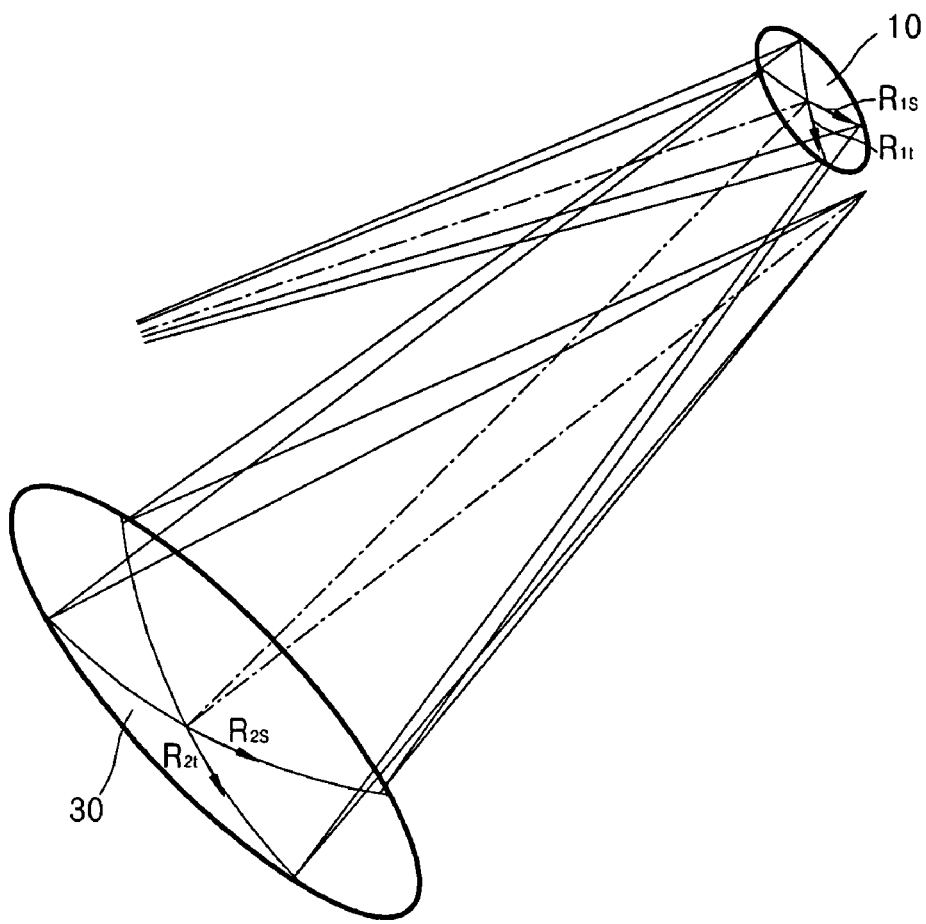
FIG. 3 is a perspective view of an off-axis projection optical system according to an example embodiment of the present invention.
Figure 4:
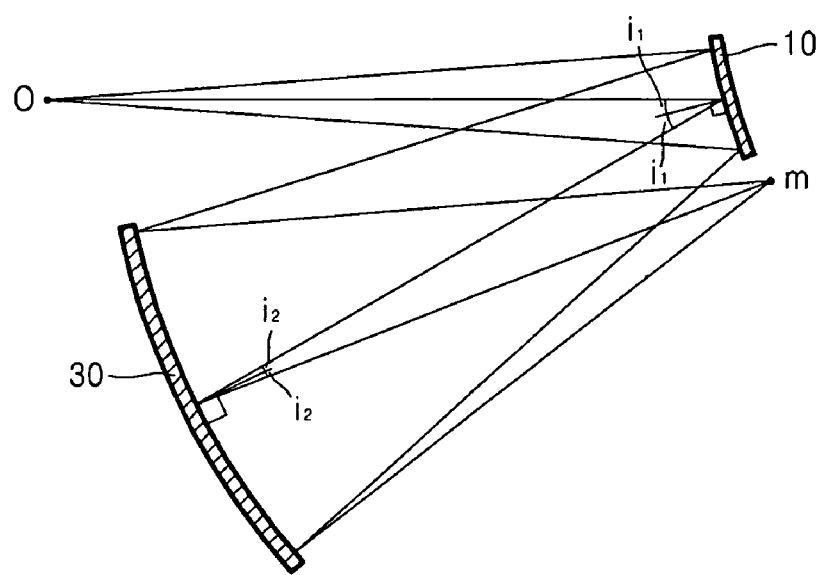
FIG. 4 is a side view of the off-axis projection optical system of FIG. 3.

FIG. 3 is a perspective view of an off-axis projection optical system according to an example embodiment of the present invention, and FIG. 4 is a side view of the off-axis projection optical system of FIG. 3.

Referring to FIGS. 3 and 4, the off-axis projection apparatus according to an example embodiment of the present invention may include a pair of first and second mirrors 10 and 30 for directing incident light to an image plane. The optical axes of the first and second mirrors 10 and 30 may be off-axially arranged. The off-axis projection optical system according to an example embodiment of the present invention may include one of more pairs of the first and second mirrors 10 and 30. The first and second mirrors 10 and 30 may be formed to satisfy Equation 1 below according to an example embodiment of the present invention.

The first mirror 10 may be a convex mirror and the second mirror 30 may be a concave mirror. In addition, one or both of the first and second mirrors 10 and 30 may be an aspheric mirror. Each of the first and second mirrors 10 and 30 may be bilaterally symmetric with respect to a center point (e.g., apex point).

The first and second mirrors 10 and 30 may satisfy the following equation 1. That is, referring to FIGS. 3 and 4, if a tangential and sagittal radii of curvature of the first mirror 10 are $R_{1t}$ and $R_{1s}$, respectively; a tangential and sagittal radii of curvature of the second mirror 30 are $R_{2t}$ and $R_{2s}$, respectively; an incident angle of the beam from an object point O to the first mirror 10 is $i_1$, and an incident angle of the beam reflected from the first mirror 10 to the second mirror 30 is $i_2$; the first and second mirrors 10 and 30 satisfy Equation 1 below.

$$R_{1t} \cos i_1 = R_{2t} \cos i_2$$

$$R_{1s} = R_{1t} \cos^2 i_1$$

$$R_{2s} = R_{2t} \cos^2 i_2 \qquad (1)$$

If the first and second mirrors 10 and 30 are designed to satisfy equation 1, the third order aberration may be reduced and/or minimized. The third order aberration is one of Seidel's five aberrations including spherical aberration, coma, astigmatism, field curvature, and distortion.

In the above-described off-axis projection optical system according to an example embodiment of the present invention, the first and second mirrors 10 and 30 may be expressed by the tenth order polynomial of Equation 2 below:

$$z = \sum_{n=2}^{10} \sum_{m=0}^{m \leq n/2} a_{n,2m} x^{2m} y^{n-2m} \quad (2)$$

where z is the height from an apex (e.g., a location where the center of a beam is incident on the mirror), $a_{n,2m}$ is a coefficient of a polynomial expression, x is the distance from the apex along an axis that is in parallel to the sagittal plane, and y is the distance from the apex of an axis along a tangential plane.

When the incident angle $i_1$ of the beam relative to the first mirror 10 is 15.257660° and the incident angle $i_2$ of the beam relative to the second mirror 30 is −4.434095°, Tables 1 and 2 below illustrate examples of polynomial coefficients for the first and second mirrors 10 and 30 expressed by the polynomial expression of Equation 2 and satisfying Equation 1.

TABLE 1

| | | |
|---|---|---|
| $x^2$: 1.2401E−03 | $y^2$: 1.0988E−03 | $x^2y$: 1.6185E−06 |
| $y^3$: 1.4662E−06 | $x^4$: 2.4522E−08 | $x^2y^2$: 4.6152E−08 |
| $y^4$: 2.1696E−08 | $x^4y$: 7.9299E−11 | $x^2y^3$: 1.3869E−10 |
| $y^5$: 6.3745E−11 | $x^6$: 6.2187E−13 | $x^4y^2$: 1.8613E−12 |
| $x^2y^4$: 1.8126E−12 | $y^6$: 5.8342E−13 | $x^6y$: −1.0996E−14 |
| $x^4y^3$: 6.9177E−15 | $x^2y^5$: −4.6916E−15 | $y^7$: −5.8437E−16 |
| $x^8$: 4.0817E−17 | $x^6y^2$: 1.2177E−16 | $x^4y^4$: 1.6695E−16 |
| $x^2y^6$: 1.1891E−16 | $y^8$: 2.7415E−17 | $x^8y$: 1.1644E−17 |
| $x^6y^3$: −1.2891E−17 | $x^4y^5$: 1.2685E−17 | $x^2y^7$: 5.6045E−18 |
| $y^9$: 9.6114E−19 | | |

TABLE 2

| | | |
|---|---|---|
| $x^2$: 1.1850E−03 | $y^2$: 1.1735E−03 | $x^2y$: −3.2669E−08 |
| $Y^3$: −3.1629E−08 | $x^4$: 1.7901E−09 | $x^2y^2$: 3.5427E−09 |
| $y^4$: 1.7524E−09 | $x^4y$: −1.7400E−13 | $x^2y^3$: −3.5141E−13 |
| $Y^5$: −1.7128E−13 | $x^6$: 5.5346E−15 | $x^4y^2$: 1.6455E−14 |
| $x^2y^4$: 1.6304E−14 | $y^6$: 5.3790E−15 | $x^6y$: −2.7616E−18 |
| $x^4y^3$: −3.4107E−18 | $x^2y^5$: −5.1155E−18 | $y^7$: −1.5540E−18 |
| $x^8$: 2.1875E−20 | $x^6y^2$: 8.9416E−20 | $x^4y^4$: 1.2709E−19 |
| $x^2y^6$: 8.9096E−20 | $y^8$: 2.2130E−20 | $x^8y$: 9.5593E−23 |
| $x^6y^3$: −1.7370E−22 | $x^4y^5$: 9.1255E−23 | $x^2y^7$: 3.5377E−23 |
| $y^9$: 4.1187E−24 | $x^{10}$: 1.0216E−25 | $x^8y^2$: 1.8425E−25 |
| $x^6y^4$: 1.4946E−24 | $x^4y^6$: 5.8667E−25 | $x^2y^8$: 2.8987E−25 |
| $y^{10}$: 6.1892E−26 | | |

If the first and second mirrors 10 and 30 are designed using the above data, a RMS wavefront error of the EUV light radiated onto an image plane, for example, the wafer is as indicated in Table 3 below.

TABLE 3

| Location | | Focus RMS (Wavefront Error) |
|---|---|---|
| X | 0.00 | 0.0029 |
| Y | 0.00 | |
| X | 0.00 | 0.0467 |
| Y | 1.00 | |
| X | 0.00 | 0.0461 |
| Y | −1.00 | |
| X | 1.00 | 0.0352 |
| Y | 0.00 | |
| X | −1.00 | 0.0352 |
| Y | 0.00 | |

In Table 3, X and Y respectively denote positions along horizontal and vertical axes with respect to a center of the image plane, for example, a center of the wafer, and X=1 or X=−1 and Y=1 or Y=−1 correspond to points located at 0.6 mm from the center of the wafer.

The focus RMS, that is, the RMS wavefront error values are represented relative to a wavelength λ of 13.5 nm. If the RMS wavefront error value is less than 0.1 λ, an image size may be less than a diffraction limit. In Table 3, when the first and second mirrors 10 and 30 are designed using the design data of Tables 1 and 2, the RMS wavefront error values are less than 0.1 λ (e.g., when the wavelength λ is 13.5 nm, the wavefront error value is approximately 1.35 nm) and thus, the diffraction limit condition may be satisfied.

From the results of Table 3, it may be noted that the off-axis projection optical system according to an example embodiment of the present invention may realize a sufficiently large, for example, 0.6 mm×0.6 mm, field size. That is, because the off-axis projection optical system according to an example embodiment of the present invention has sufficiently small third order aberration, the sufficiently large field size may be realized.

Figure 5:
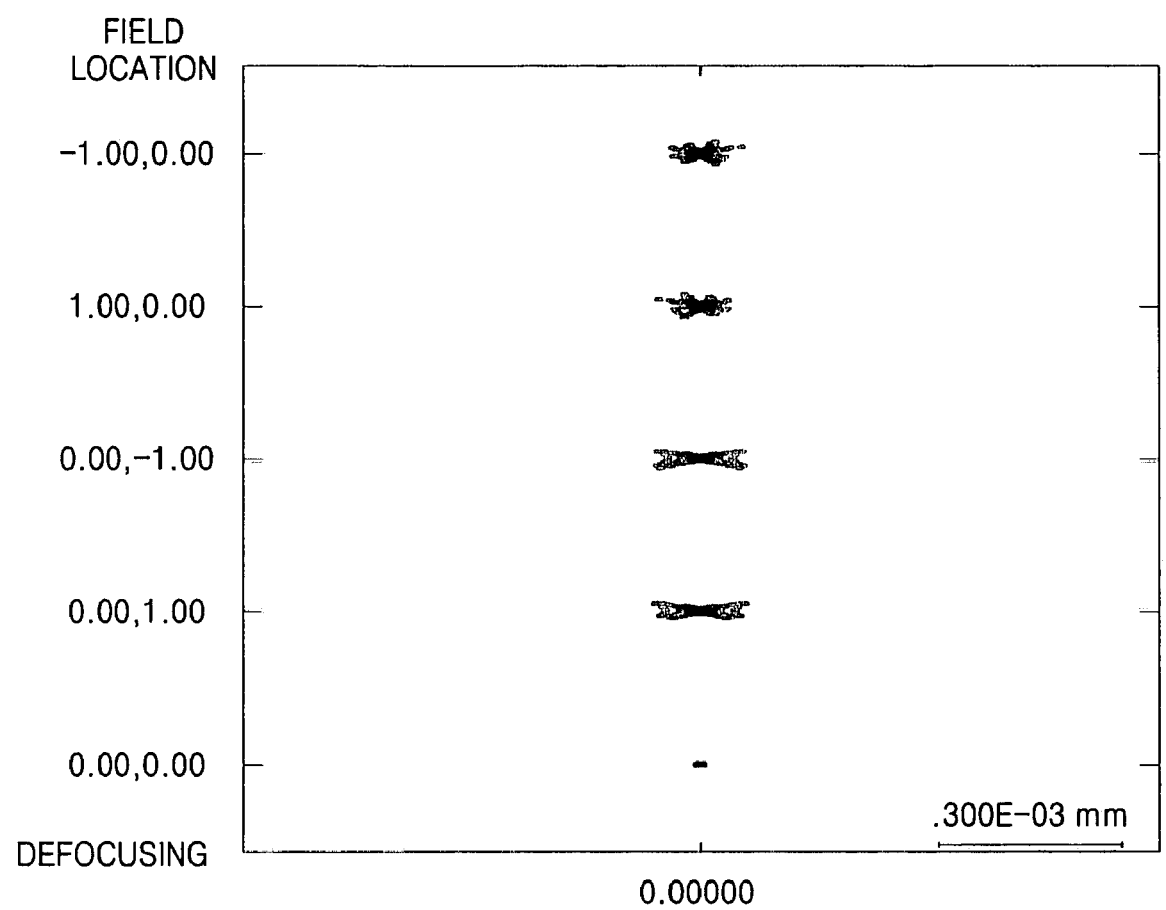
FIG. 5 is a view illustrating spot diagrams, which may be formed on an image plane or a wafer disposed on the image plane at each field location indicated in Table 3 by the off-axis projection optical system according to an example embodiment of the present invention.

FIG. 5 is a view illustrating spots formed by an off-axis projection optical system according to an example embodiment of the present invention on an image plane or a wafer disposed on the image plane at each field location indicated by Table 3. In FIG. 5, the size of the scale bar is 30 nm. Based on a comparison with the scale bar, it is shown from FIG. 5 that the spots may be smaller than 20 nm in regions of the 0.6 mm×0.6 mm field.

Here, the diffraction limit is about 30 nm. From the results of Table 3 and FIG. 5, it may be noted that the spot may be focused to a region smaller than 20 nm, which is less than a luminescent intensity diffraction limit at X=0.6 mm and Y=0.6 mm from the center of the wafer.

Unlike the conventional on-axis projection optical system, because stray light traveling directly toward the image plane is not generated in the off-axis projection optical system according to an example embodiment of the present invention, no shielding member is used and/or necessary and thus, problems such as diffraction, scattering and flare may be reduced and/or eliminated.

Although the projection optical system of the present invention has an off-axis structure, because the third order aberration (e.g., the Seidel's aberration), which is a general aberration, may be reduced and/or minimized, the sufficiently large, for example, 0.6 mm×0.6 mm, field size may be realized.

Figure 6:
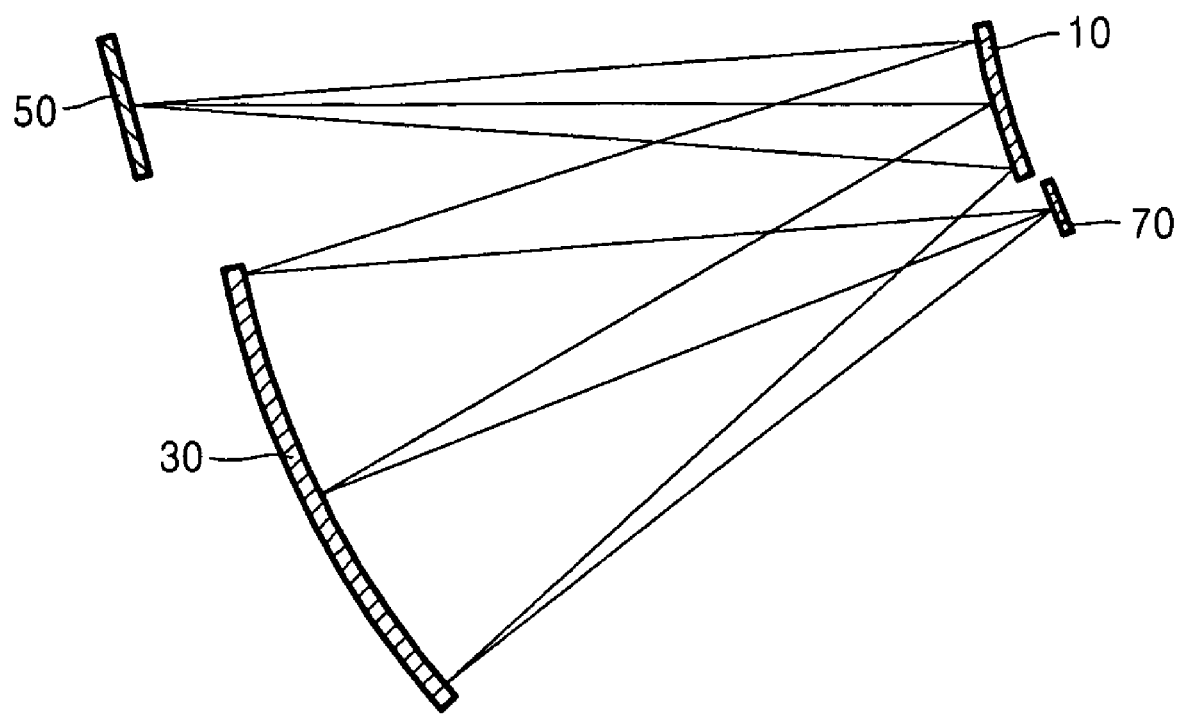
FIG. 6 is a side view of a EUV lithography apparatus including an off-axis projection optical system according to an example embodiment of the present invention.

FIG. 6 is a side view of a EUV lithography apparatus that may irradiate a beam having mask pattern information to a wafer using the off-axis projection optical system of FIGS. 3 and 4.

Referring to FIGS. 3, 4 and 6, a reflective mask 50 having a pattern may be disposed on an object plane and a wafer 70 may be disposed on an image plane. The EUV beam irradiated to the reflective mask 50 may be reflected from the reflective mask 50 to the first mirror 10. The EUV beam reflected from the first mirror 10 may be incident on the second mirror 30. Then, this EUV beam may be reflected from the second mirror 30 and focused on the wafer 70, which may be disposed on the image plane to form a pattern corresponding to the pattern formed on the reflective mask 50.

The number of mirrors used in an off-axis projection optical system according to an example embodiment of the present invention may be at least two. However, considering the installation locations and orientations of the reflective mask and the wafer that may be used and/or required in the EUV lithography apparatus, one or more additional mirrors may be used in the off-axis projection optical system according to an example embodiment of the present invention.

In the above-description, although an off-axis projection optical system of an example embodiment of the present invention may be applied to a EUV lithography apparatus, the present invention is not limited to EUV lithography apparatuses. That is, an off-axis projection optical system according to an example embodiment of the present invention may be applied to a variety of optical apparatuses.

Unlike the conventional on-axis projection optical system, because stray light traveling directly toward the image plane may be reduced and/or eliminated in an off-axis projection optical system according to an example embodiment of the present invention, a shielding member is unnecessary.

Furthermore, although a projection optical system according to an example embodiment of the present invention has an off-axis structure, the third order aberration (e.g., the Seidel's aberration), which is a general aberration, may be reduced and/or minimized, a sufficiently large field size may be realized.

While the present invention has been particularly shown and described with reference to example embodiments of the present invention, it will be understood by those of ordinary skill in the art that various changes in form and details may be made therein without departing from the spirit and scope of the present invention.

What is claimed is:

1. An off-axis projection optical system comprising:
   first and second mirrors that are off-axially arranged, the first mirror being a convex mirror and the second mirror being a concave mirror,
   wherein if
      a tangential and sagittal radii of curvature of the first mirror are $R_{1t}$ and $R_{1s}$, respectively;
      a tangential and sagittal radii of curvature of the second mirror are $R_{2t}$ and $R_{2s}$, respectively;
      an incident angle of a beam from an object point to the first mirror is $i_1$; and
      an incident angle of the beam reflected from the first mirror to the second mirror is $i_2$, the following is satisfied:

$R_{1t} \cos i_1 = R_{2t} \cos i_2$ $R_{1s} = R_{1t} \cos^2 i_1$ $R_{2s} = R_{2t} \cos^2 i_2$.

2. The off-axis projection optical system of claim 1, wherein each of the first and second mirrors are bilaterally symmetric.

3. The off-axis projection optical system of claim 1, wherein each of the first and second mirrors is an aspheric mirror.

4. The off-axis projection optical system of claim 1, wherein each of the first and second mirrors is bilaterally symmetric.

5. A lithography apparatus irradiating a beam having mask pattern information to a wafer by using the off-axis projection optical system of claim 1.

6. The lithography apparatus of claim 5, wherein the first mirror is a convex mirror and the second mirror is a concave mirror.

7. The lithography apparatus of claim 6, wherein each of the first and second mirrors is an aspheric mirror.

8. The lithography apparatus of claim 7, wherein each of the first and second mirrors are bilaterally symmetric.

9. The lithography apparatus of claim 5, wherein each of the first and second mirrors is an aspheric mirror.

10. The lithography apparatus of claim 5, wherein each of the first and second mirrors is bilaterally symmetric.

11. The lithography apparatus of claim 5, wherein the beam is an extreme ultraviolet (EUV) beam.

12. The lithography apparatus of claim 11, wherein the mask is a reflective mask.

13. An off-axis projection optical system comprising:
   a first mirror for reflecting an extreme ultraviolet (EUV) beam; and
   a second mirror for reflecting the EUV beam, wherein
   the first and the second mirror are arranged off-axially and configured to reduce third order aberration, and their corresponding optical axes are arranged at a non-zero angle with respect to each other.

14. A lithography apparatus, comprising:
   the off-axis projection optical system of claim 13, wherein the lithography apparatus does not include a shielding element.

15. An off-axis projection optical system comprising:
   first and second mirrors that are off-axially arranged,
   wherein if
      a tangential and sagittal radii of curvature of the first mirror are $R_{1t}$ and $R_{1s}$, respectively;
      a tangential and sagittal radii of curvature of the second mirror are $R_{2t}$ and $R_{2s}$, respectively;
      an incident angle of a beam from an object point to the first mirror is $i_1$; and
      an incident angle of the beam reflected from the first mirror to the second mirror is $i_2$, the following is satisfied:

$R_{1t} \cos i_1 = R_{2t} \cos i_2$ $R_{1s} = R_{1t} \cos^2 i_1$ $R_{2s} = R_{2t} \cos^2 i_2$, wherein $R \neq \infty$.

16. The off-axis projection optical system of claim 15, wherein the first mirror is a convex mirror and the second mirror is a concave mirror.

17. The off-axis projection optical system of claim 15, wherein each of the first and second mirrors is an aspheric mirror.

18. The off-axis projection optical system of claim 15, wherein each of the first and second mirrors is bilaterally symmetric.

* * * * *